(12) United States Patent
Hower et al.

(10) Patent No.: US 9,202,692 B2
(45) Date of Patent: Dec. 1, 2015

(54) HIGH VOLTAGE DEPLETION MODE N-CHANNEL JFET

(71) Applicant: Texas Instruments Incorporated, Dallas, TX (US)

(72) Inventors: Philip Leland Hower, Concord, MA (US); Sameer Pendharkar, Allen, TX (US); Marie Denison, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/572,936

(22) Filed: Dec. 17, 2014

(65) Prior Publication Data

US 2015/0179452 A1 Jun. 25, 2015

Related U.S. Application Data

(60) Provisional application No. 61/918,346, filed on Dec. 19, 2013.

(51) Int. Cl.
*H01L 29/66* (2006.01)
*H01L 21/225* (2006.01)
*H01L 27/098* (2006.01)
*H01L 21/8232* (2006.01)
*H01L 29/06* (2006.01)
*H01L 21/266* (2006.01)

(52) U.S. Cl.
CPC .......... *H01L 21/2253* (2013.01); *H01L 21/266* (2013.01); *H01L 21/8232* (2013.01); *H01L 27/098* (2013.01); *H01L 29/0634* (2013.01)

(58) Field of Classification Search
CPC . H01L 27/098; H01L 21/2253; H01L 21/266; H01L 29/0634
USPC .......................................................... 257/272
See application file for complete search history.

(56) References Cited

U.S. PATENT DOCUMENTS 8,674,439 B2 * 3/2014 Sdrulla et al. ................. 257/341

* cited by examiner

*Primary Examiner* — Tu-Tu Ho
(74) *Attorney, Agent, or Firm* — Jacqueline J. Garner; Frank D. Cimino

(57) ABSTRACT

An integrated circuit and method having a JFET with a buried drift layer and a buried channel in which the buried channel is formed by implanting through segmented implant areas so that the doping density of the buried channel is between 25 percent and 50 percent of the doping density of the buried drift layer.

20 Claims, 7 Drawing Sheets

HIGH VOLTAGE DEPLETION MODE N-CHANNEL JFET

CROSS-REFERENCE TO RELATED APPLICATIONS

This application claims the benefit of priority under U.S.C. §119(e) of U.S. Provisional Application 61/918,346, filed Dec. 19, 2013, which is hereby incorporated by reference in its entirety.

FIELD OF THE INVENTION

This invention relates to the field of integrated circuits. More particularly, this invention relates to junction field effects transistors (JFETs) in integrated circuits.

BACKGROUND OF THE INVENTION

An integrated circuit may contain a depletion mode junction field effect transistor (JFET) which is desired to have a breakdown voltage over 500 volts, a pinch-off voltage less than 10 volts, and an on-state current density greater than 1 microamp per micron of transistor width per volt or drain bias, for example in a startup circuit. It may further be desired to fabricate the integrated circuit using as few photolithographic operations as possible. Simultaneously achieving the desired operating and fabrication goals has been problematic. For example, a depletion mode JFET with a breakdown voltage above 500 volts commonly includes a long drift region. A drift region which is sufficiently doped to provide an on-state current density greater than 1 microamp per micron of transistor width per volt or drain bias may exhibit a pinch-off voltage greater than 20 volts. Conversely, a drift region which is doped lightly enough to provide a pinch-off voltage less than 10 volts may exhibit an on-state current density less than 1 microamp per micron of transistor width per volt of drain bias.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method having a JFET with a buried drift layer and a buried channel in which the buried channel is formed by implanting through segmented implant areas.

DETAILED DESCRIPTION OF EXAMPLE EMBODIMENTS

Figure 1:
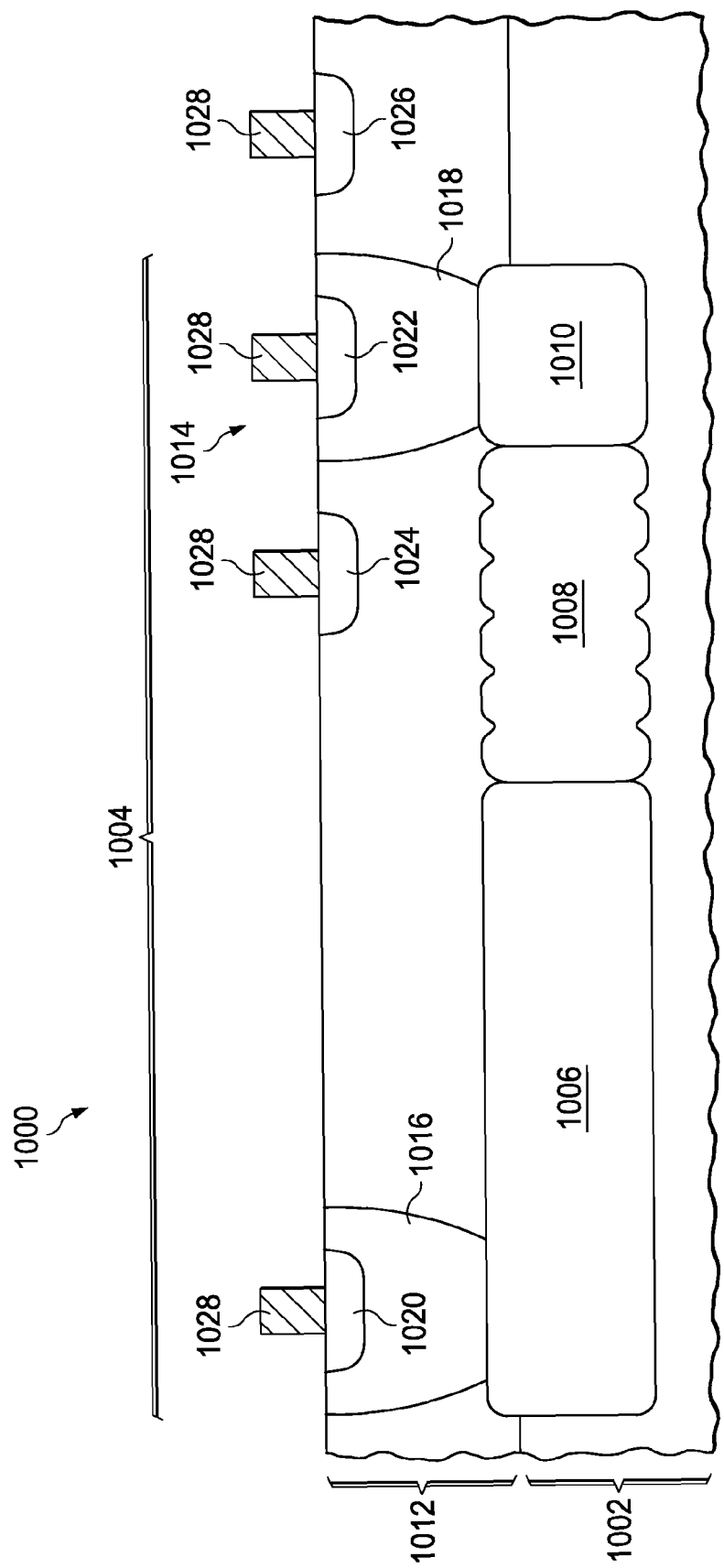
FIG. 1 is a cross-section of an integrated circuit containing a JFET formed according to an example.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may contain a JFET which simultaneously exhibits a breakdown voltage over 500 volts, a pinch-off voltage less than 10 volts, and an on-state current density greater than 1 microamp per micron of transistor width per volt or drain bias. The integrated circuit is formed by concurrently ion implanting a buried drift layer and a buried channel abutting the buried drift layer. An implant mask for the buried drift layer and the buried channel has segmented implant areas at the channel end. An epitaxial growth operation forms a gate and RESURF region above a buried channel implanted region, and possibly with an optional anneal operation, diffuses the implanted dopants to form a contiguous doping distribution in the channel. The channel has an average doping density between 25 percent and 60 percent of an average doping density of the drift region.

FIG. 1 is a cross-section of an integrated circuit containing a JFET formed according to an example. The integrated circuit 1000 is formed in and on a substrate 1002 which may be a single crystal silicon wafer, a silicon-on-insulator (SOI) wafer, a hybrid orientation technology (HOT) wafer with regions of different crystal orientations, or other material appropriate for fabrication of the integrated circuit 1000. In versions of the instant example in which the JFET is n-channel, the substrate 1002 is p-type. In one version of the instant example, the substrate 1002 may have a bulk resistivity higher than 50 ohm-cm. An epitaxial growth operation is performed on the integrated circuit after the ion implant which grows an epitaxial layer 1012 on a top surface of the substrate 1002. In an n-channel JFET 1004, the epitaxial layer 1012 is p-type. In one version of the instant example, the epitaxial layer 1012 may have a bulk resistivity higher than 5 ohm-cm.

The JFET 1004 includes a buried drift layer 1006. In an n-channel JFET 1004, the buried drift layer 1006 is n-type. In one version of the instant example, the buried drift layer 1006 may be doped with phosphorus to an average density between $1 \times 10^{16}\,\text{cm}^{-3}$ and $5 \times 10^{16}\,\text{cm}^{-3}$. In one version, the buried drift layer 1006 may be between 3 and 7 microns thick, and a top surface of the buried drift layer 1006 may be between 2 and 4 microns below a top surface of the epitaxial layer 1012. The JFET 1004 also includes a buried channel 1008 abutting a channel end of the buried drift layer 1006. An average doping density of the buried channel 1008 is between 25 percent and 50 percent of the average doping density of the buried drift layer 1006. In an n-channel JFET 1004, the buried channel 1008 is n-type. The buried drift layer 1006 and the buried channel 1008 are formed concurrently by ion implanting dopants through an implant mask with segmented implant areas over a region defined for the buried channel 1008. An average thickness of the buried channel 1008 is between 75 percent and 100 percent of the average thickness of the buried drift layer 1006. In one version of the instant example, the buried channel 1008 may be doped with phosphorus to an average density between $3 \times 10^{15}$ cm$^3$ and $1.5 \times 10^{16}$ cm$^{-3}$. Forming the buried channel 1008 to have an average doping density between $3 \times 10^{15}$ cm$^{-3}$ and $1.5 \times 10^{16}$ cm$^{-3}$ may provide a pinch-off voltage less than 10 volts. Forming the buried drift layer 1006 to have a higher doping density than the buried channel 1008 may provide an on-state current density greater than 1 microamp per micron of transistor width per volt or drain bias. In one version of the instant example, the buried channel 1008 may be between 30 and 60 microns long. An optional source buried layer 1010 abutting the buried channel 1008 opposite the buried drift layer 1006 may be formed concurrently with the buried drift layer 1006 and the buried channel 1008. In an n-channel JFET 1004, the source buried layer 1010 is n-type. An optional anneal process may also be performed on the integrated circuit 1000. During the epitaxial growth operation and anneal process if performed, the implanted dopants diffuse so as to form a contiguous doping distribution in the buried channel 1008. The epitaxial material over the buried channel 1008 forms a gate 1014 of the JFET 1004. In an n-channel JFET 1004, the gate 1014 is p-type.

A drain well 1016 is formed in the epitaxial layer 1012 extending to the buried drift layer 1006 at a drain end of the buried drift layer 1006. In an n-channel JFET 1004, the drain well 1016 is n-type. A source well 1018 is formed in the epitaxial layer 1012 adjacent to the gate 1014 opposite from the drain well 1016, extending to the source buried layer 1010 if formed, as depicted in FIG. 1, or possibly to the buried channel 1008. In an n-channel JFET 1004, the source well 1018 is n-type. The drain well 1016 and the source well 1018 may be formed concurrently. An optional drain contact diffused region 1020 may be formed in the drain well 1016, having a same conductivity type as the drain well 1016. An optional source contact diffused region 1022 may be formed in the source well 1018, having a same conductivity type as the source well 1018. An optional gate diffused contact region 1024 may be formed in the gate 1014 having a same conductivity type as the gate 1014. An optional substrate diffused contact region 1026 may be formed in the epitaxial layer 1012 having a same conductivity type as the epitaxial layer 1012. Contacts 1028 are formed over the substrate 1002 to make electrical connections to the drain well 1016, the source well 1018, the gate 1014 and the epitaxial layer 1012, through the drain contact diffused region 1020, the source contact diffused region 1022, the gate diffused contact region 1024 and the substrate diffused contact region 1026, respectively, if present.

Figure 2A:
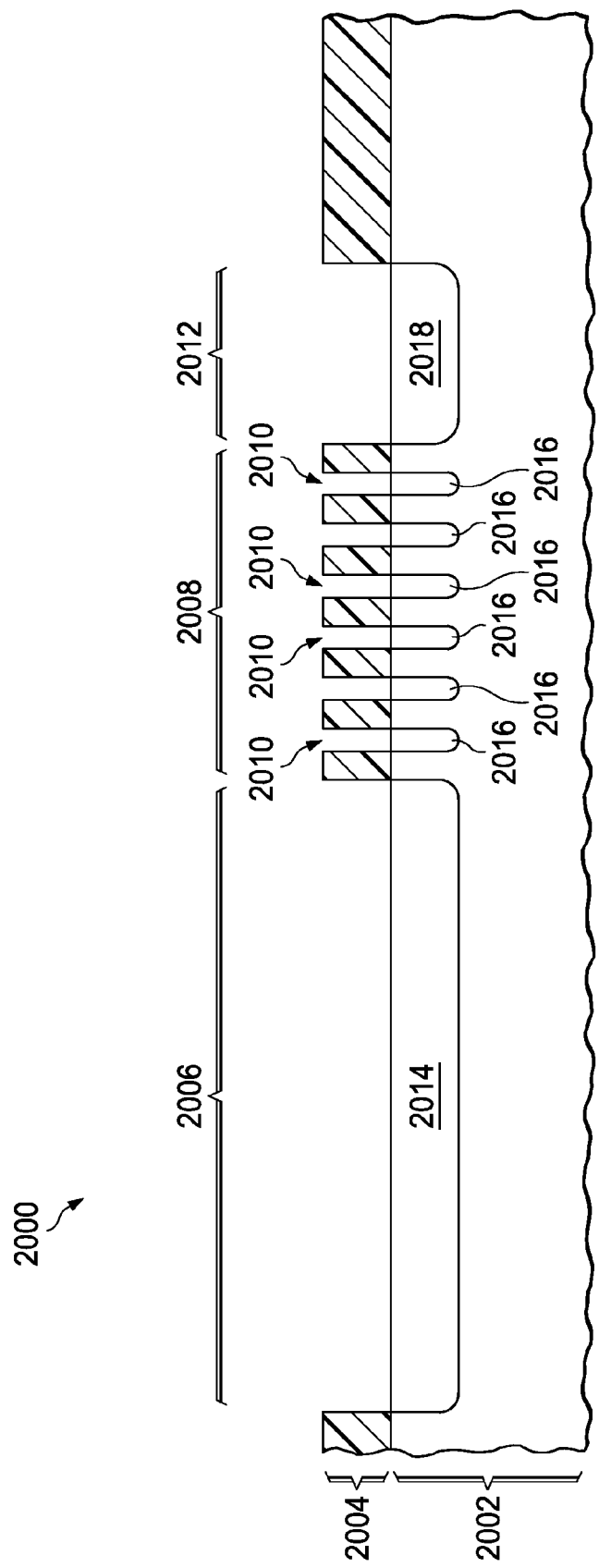
FIG. 2A and FIG. 2B are cross-sections of an integrated circuit containing a JFET formed according to an example similar to that described in reference to FIG. 1, depicted in successive stages of fabrication.
Figure 2B:
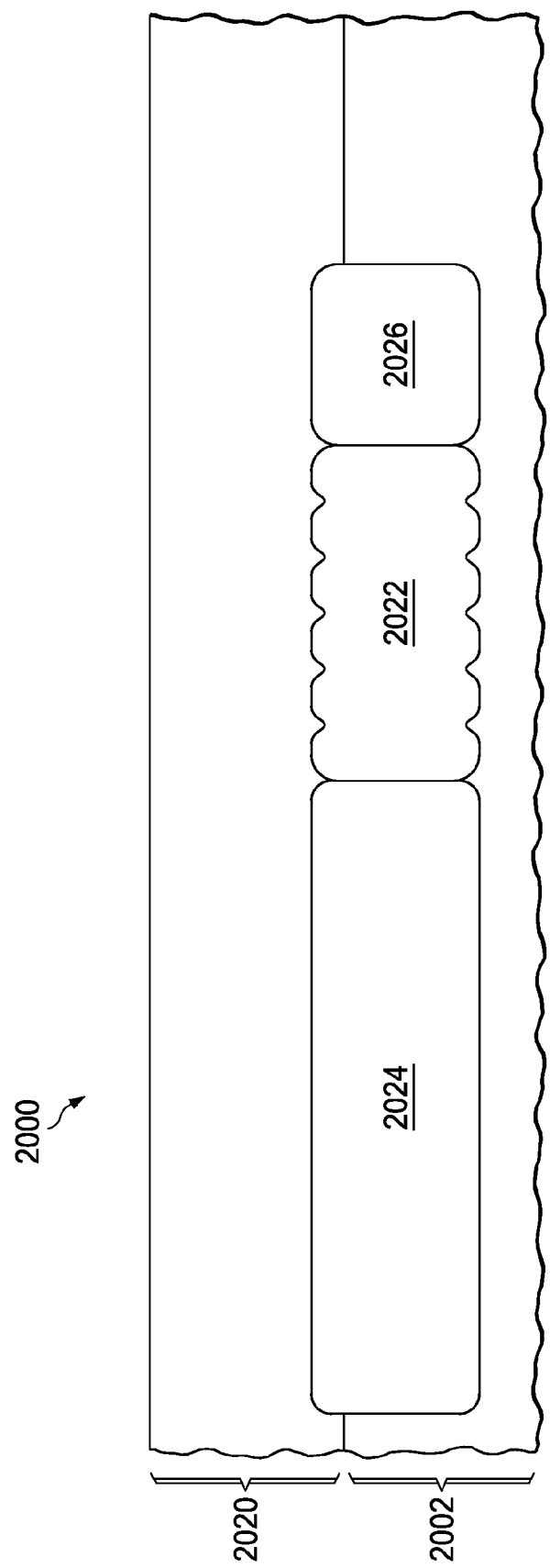

FIG. 2A and FIG. 2B are cross-sections of an integrated circuit containing a JFET formed according to an example similar to that described in reference to FIG. 1, depicted in successive stages of fabrication. Referring to FIG. 2A, fabrication of the integrated circuit 2000 starts with a substrate 2002 having the properties described in reference to FIG. 1. An implant mask 2004 is formed over the substrate 2002. The implant mask 2004 includes a substantially open drift area 2006 in which the substrate 2002 is exposed by the implant mask 2004 in at least 90 percent of the drift area 2006. The implant mask 2004 also includes a channel area 2008 adjacent to the drift area 2006 which contains segmented implant areas 2010 so that the substrate 2002 is exposed by the segmented implant areas 2010 in between 25 percent and 50 percent of the channel area 2008. A pitch dimension of the segmented implant areas 2010 is defined as a width of an implanted area 2010 plus a width of an adjacent implant mask element. The segmented implant areas 2010 are configured so that the pitch dimension of the segmented implant areas 2010 is not greater than 7 microns. Configurations of the segmented implant areas 2010 will be discussed in more detail in reference to FIG. 3 through FIG. 6. The implant mask 2004 may also include an optional source area 2012 adjacent to the channel area 2008 opposite from the drift area 2006 in which the substrate 2002 is exposed by a fraction at least as high as in the channel area 2008. The implant mask 2004 may include any combination of photoresist, organic anti-reflection material such as is used in a bottom anti-reflection coating (BARC), silicon dioxide, silicon nitride and other inorganic dielectric material.

An ion implant operation is performed on the integrated circuit 2000 which implants dopants into the substrate 2002 in areas exposed by the implant mask 2004 to form a drift implanted region 2014 and segmented channel implanted regions 2016. The ion implant operation also forms a source implanted region 2018 if the source area 2012 is present. In an n-channel JFET, the dopants are n-type dopants such as phosphorus. Arsenic or antimony dopants may also be used. In one version of the instant example, phosphorus is implanted at a dose between $1 \times 10^{12}$ cm$^{-2}$ and $2.5 \times 10^{12}$ cm$^{-2}$.

Referring to FIG. 2B, an epitaxial layer 2020 is grown on a top surface of the substrate 2002. In one version of the instant example, the epitaxial layer 2020 may be between 2.5 and 5.0 microns thick. An optional anneal process may also be performed on the integrated circuit 1000, either prior to or subsequent to formation of the epitaxial layer 2020. During the epitaxial growth operation and the anneal process if performed, the implanted dopants in the segmented channel implanted regions 2016 of FIG. 2A diffuse so as to form a contiguous doping distribution in a buried channel 2022 of the JFET. The implanted dopants in the drift implanted region 2014 and the source implanted region 2018 if present diffuse to form a buried drift layer 2024 of the JFET and a source buried layer 2026 of the JFET, respectively. A spatial distribution of dopants in the buried channel 2022 overlaps a spatial distribution of dopants in the buried drift layer 2024, and overlaps a spatial distribution of dopants in the source buried layer 2026 if present, so that the buried channel 2022 is directly electrically connected to the buried drift layer 2024 and the source buried layer 2026. During the epitaxial growth operation and the anneal process if performed, a portion of the implanted dopants in the buried channel 2022, the buried drift layer 2024 and the source buried layer 2026 if present diffuse into the epitaxial layer 2020. In subsequent fabrication steps, elements are formed in the integrated circuit 2000 to produce the JFET as described in reference to FIG. 1.

Figure 3:
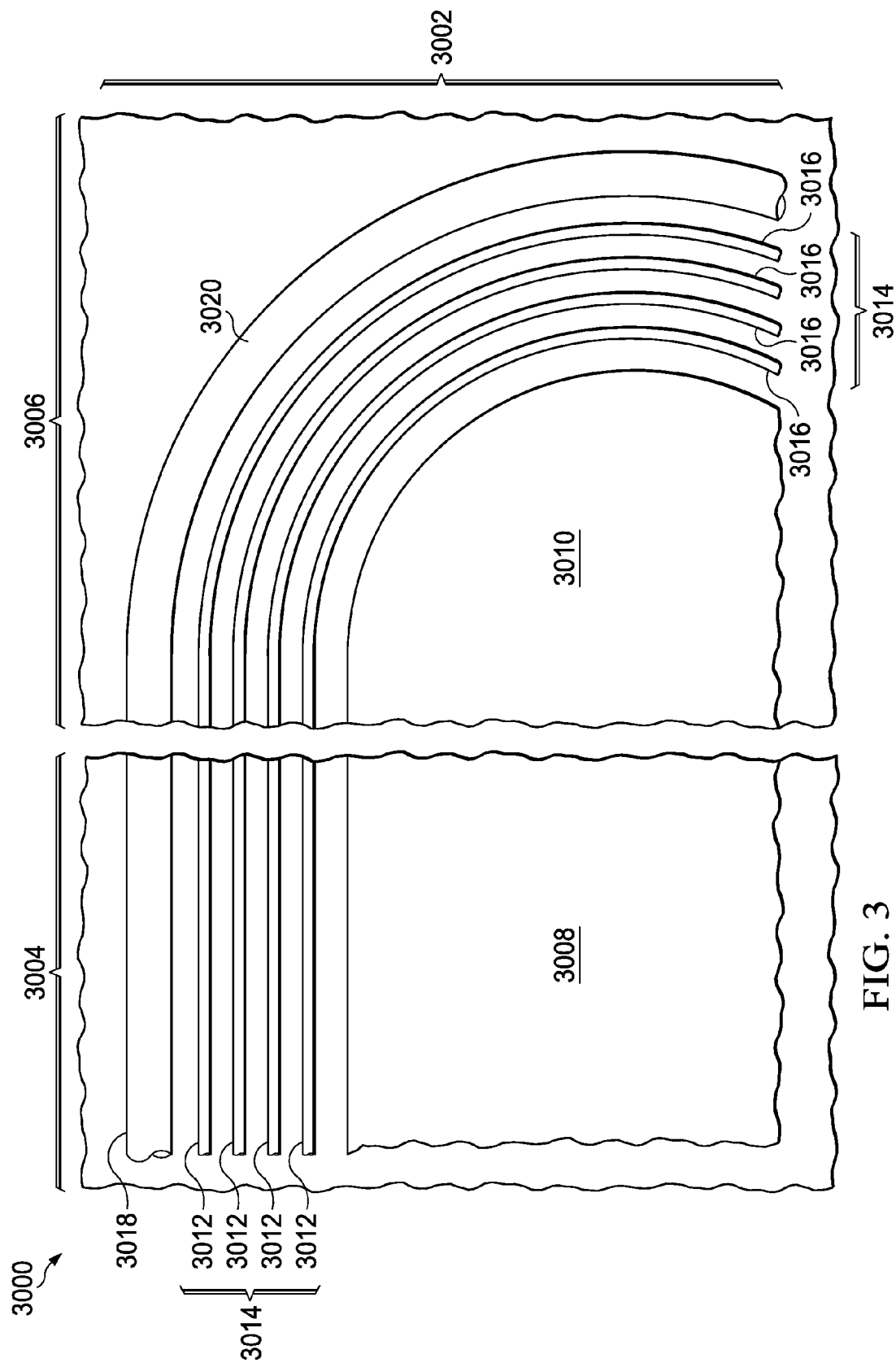
FIG. 3 is a top view of an integrated circuit containing a JFET formed according to an example.

FIG. 3 is a top view of an integrated circuit containing a JFET formed according to an example. The integrated circuit 3000 has an implant mask 3002 in a linear region 3004 and a rounded end region 3006 of the JFET. The implant mask 3002 has a substantially open linear drift area 3008 in the linear region 3004 and a substantially open rounded drift area 3010 in the rounded end region 3006. The implant mask 3002 further includes a set of equally spaced linear longitudinal segmented implant areas 3012 in a channel area 3014 in the linear region 3004, and a set of equally radially spaced arced segmented implant areas 3016 in the channel area 3014 in the rounded end region 3006. The implant mask 3002 may also include a linear source area 3018 in the linear region 3004 and an arced source area 3018 in the rounded end region 3006. In one version of the instant example, the integrated circuit 3000 may be formed using only one or more instances of the linear drift area 3008, the linear longitudinal segmented implant areas 3012 and possibly the linear source area 3018 in the implant mask 3002. In another version, the integrated circuit 3000 may be formed using only one or more instances of the rounded drift area 3010, the arced segmented implant areas 3016 and possibly the arced source area 3018.

Figure 4:
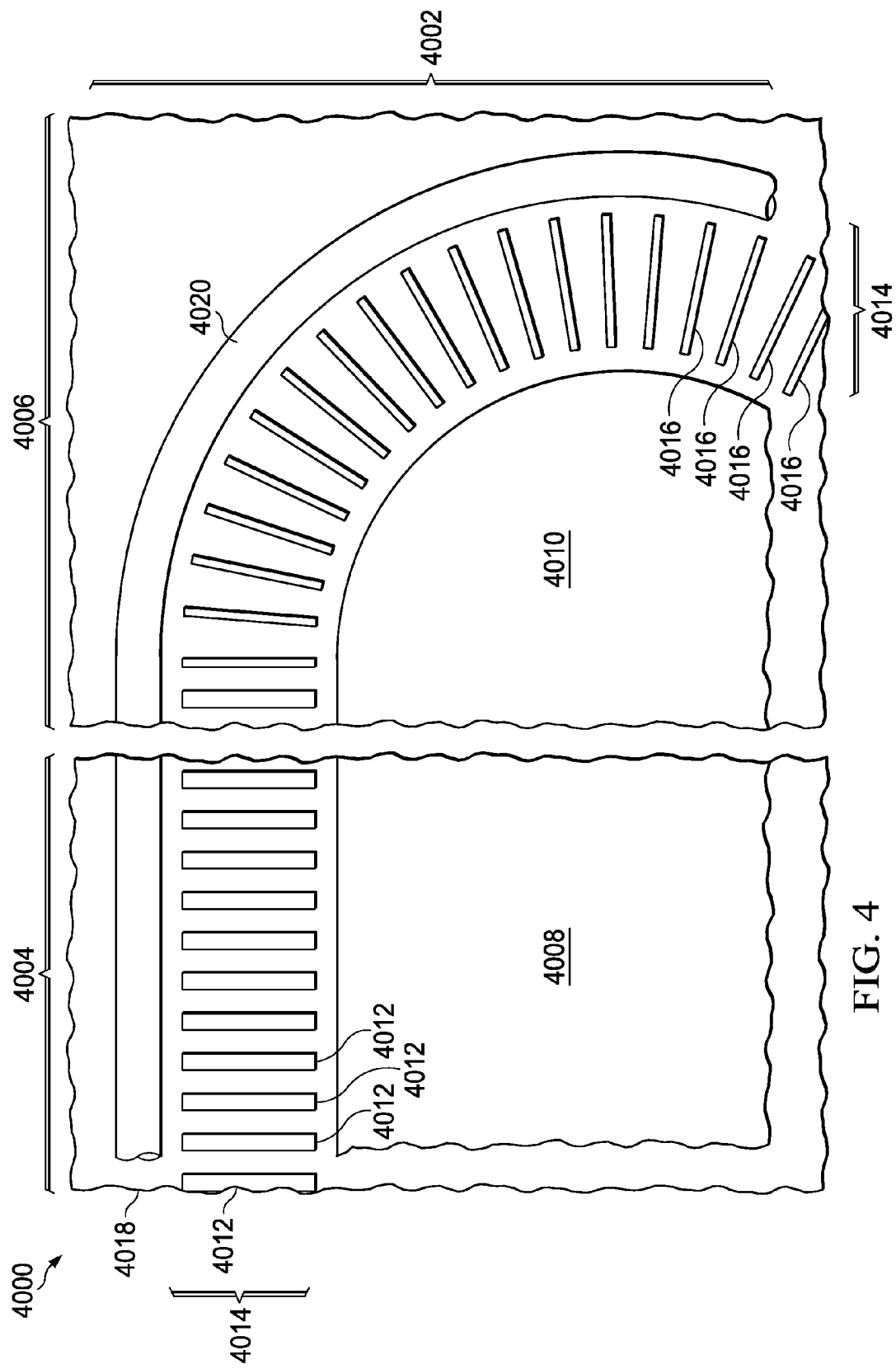
FIG. 4 is a top view of an integrated circuit containing a JFET formed according to another example.

FIG. 4 is a top view of an integrated circuit containing a JFET formed according to another example. The integrated circuit 4000 has an implant mask 4002 in a linear region 4004 and a rounded end region 4006 of the JFET. The implant mask 4002 has a substantially open linear drift area 4008 in the linear region 4004 and a substantially open rounded drift area 4010 in the rounded end region 4006. The implant mask 4002 further includes a set of equally spaced linear axial segmented implant areas 4012 in a channel area 4014 in the linear region 4004, and a set of equally angularly spaced radial segmented implant areas 4016 in the channel area 4014 in the rounded end region 4006. The radial segmented implant areas 4016 may be tapered as depicted in FIG. 4 or may be rectangular. The implant mask 4002 may also include a linear source area 4018 in the linear region 4004 and an arced source area 4018 in the rounded end region 4006. In one version of the instant example, the integrated circuit 4000 may be formed using only one or more instances of the linear drift area 4008, the linear axial segmented implant areas 4012 and possibly the linear source area 4018 in the implant mask 4002. In another version, the integrated circuit 4000 may be formed using only one or more instances of the rounded drift area 4010, the radial segmented implant areas 4016 and possibly the arced source area 4018.

Figure 5:
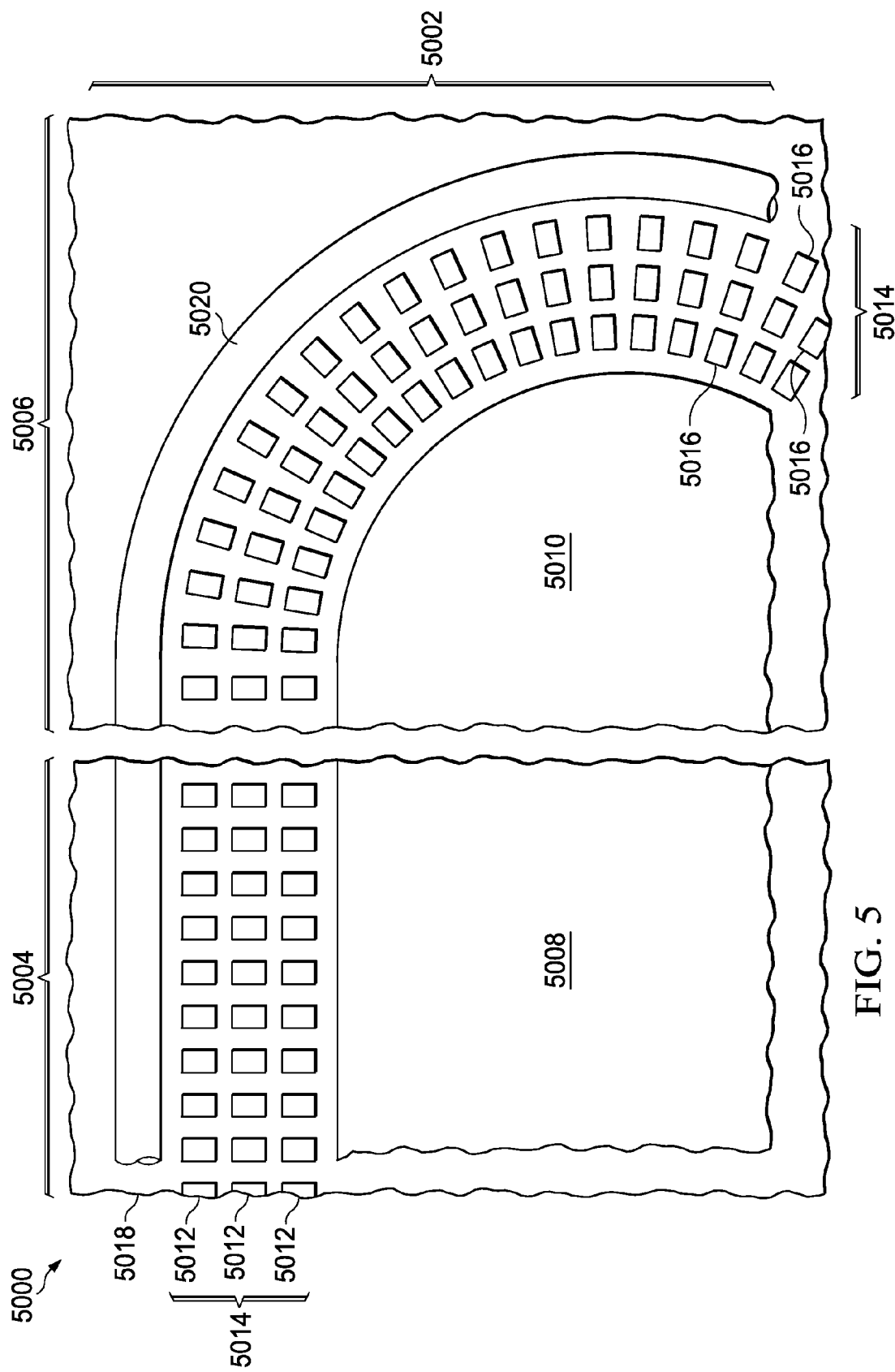
FIG. 5 is a top view of an integrated circuit containing a JFET formed according to a further example.

FIG. 5 is a top view of an integrated circuit containing a JFET formed according to a further example. The integrated circuit 5000 has an implant mask 5002 in a linear region 5004 and a rounded end region 5006 of the JFET. The implant mask 5002 has a substantially open linear drift area 5008 in the linear region 5004 and a substantially open rounded drift area 5010 in the rounded end region 5006. The implant mask 5002 further includes a set of equally spaced linear doubly segmented implant areas 5012 in a channel area 5014 in the linear region 5004, and a set of equally angularly and equally radially spaced arced doubly segmented implant areas 5016 in the channel area 5014 in the rounded end region 5006. The arced doubly segmented implant areas 5016 may be tapered as depicted in FIG. 5 or may be rectangular. The implant mask 5002 may also include a linear source area 5018 in the linear region 5004 and an arced source area 5018 in the rounded end region 5006. In one version of the instant example, the integrated circuit 5000 may be formed using only one or more instances of the linear drift area 5008, the linear doubly segmented implant areas 5012 and possibly the linear source area 5018 in the implant mask 5002. In another version, the integrated circuit 5000 may be formed using only one or more instances of the rounded drift area 5010, the arced doubly segmented implant areas 5016 and possibly the arced source area 5018.

Figure 6:
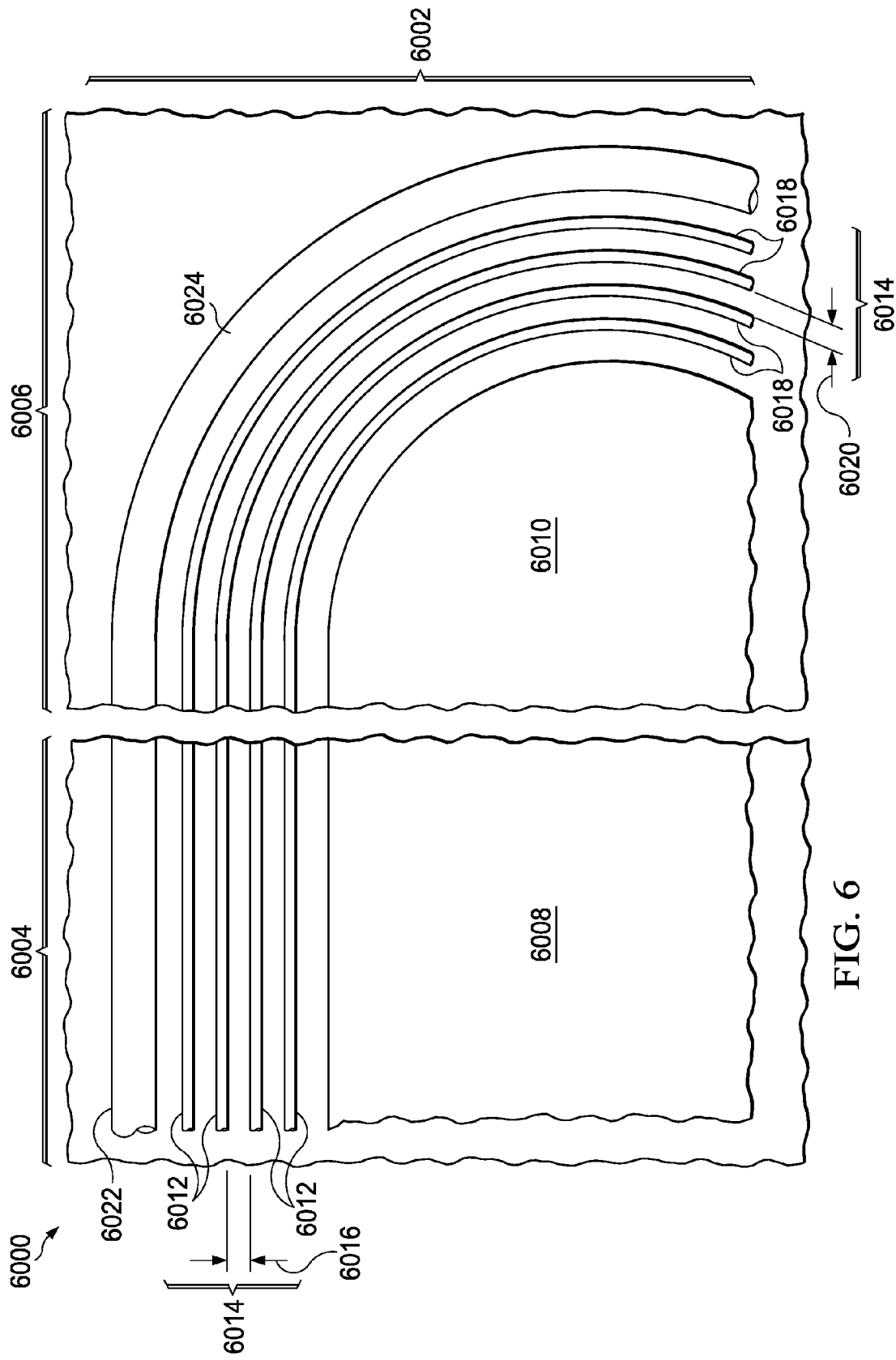
FIG. 6 is a top view of an integrated circuit containing a JFET formed according to a variation of the example described in reference to FIG. 3.

FIG. 6 is a top view of an integrated circuit containing a JFET formed according to a variation of the example described in reference to FIG. 3. The integrated circuit 6000 has an implant mask 6002 in a linear region 6004 and a rounded end region 6006 of the JFET. The implant mask 6002 has a substantially open linear drift area 6008 in the linear region 6004 and a substantially open rounded drift area 6010 in the rounded end region 6006. The implant mask 6002 further includes a set of graduated spaced linear longitudinal segmented implant areas 6012 in a channel area 6014 in the linear region 6004, such that an axial separation distance 6016 between segmented implant areas 6012 increases as a function of distance from the linear drift area 6008. The implant mask 6002 also includes a set of graduated radially spaced arced segmented implant areas 6018 in the channel area 6014 in the rounded end region 6006, such that a radial separation distance 6020 between segmented implant areas 6018 increases as a function of distance from the rounded drift area 6010. The implant mask 6002 may also include a linear source area 6022 in the linear region 6004 and an arced source area 6022 in the rounded end region 6006. In one version of the instant example, the integrated circuit 6000 may be formed using only one or more instances of the linear drift area 6008, the linear longitudinal segmented implant areas 6012 and possibly the linear source area 6022 in the implant mask 6002. In another version, the integrated circuit 6000 may be formed using only one or more instances of the rounded drift area 6010, the arced segmented implant areas 6018 and possibly the arced source area 6022. It will be recognized that graduated axial and radial spacing configurations may be applied to the examples discussed in reference to FIG. 4 and FIG. 5.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. An integrated circuit, comprising:
a substrate, the substrate having a first conductivity type;
an epitaxial layer on the substrate, the epitaxial layer having the conductivity type of the substrate;
a junction field effect transistor (JFET), the JFET including:
a buried drift layer in the substrate and the epitaxial layer so that a top surface of the buried drift layer is below a top surface of the epitaxial layer, the buried drift layer having an opposite conductivity type from the substrate, the buried drift layer having a channel end and a drain end;
a buried channel in the substrate and the epitaxial layer abutting the channel end of the buried drift layer, the buried channel having the conductivity type of the buried drift layer, the buried channel having an average doping density in the buried channel between 25 percent and 50 percent of an average doping density in the buried drift layer and an average thickness between 75 percent and 100 percent of an average thickness of the buried drift layer;
a gate in the epitaxial layer above the buried channel;
a drain well in the epitaxial layer extending to the drain end of the buried drift layer, the drain well having the conductivity type of the buried drift layer; and
a source well in the epitaxial layer adjacent to the gate opposite from the drain well, the source well having the conductivity type of the buried drift layer.

2. The integrated circuit of claim 1, wherein the JFET further includes a buried source layer in the substrate and the epitaxial layer abutting the buried channel opposite the buried drift layer, the buried source layer having the conductivity type of the buried drift later, such that the source well extends to the buried source layer.

3. The integrated circuit of claim 2, wherein the buried channel is between 30 and 60 microns long.

4. The integrated circuit of claim 3, wherein the buried drift layer is between 3 and 7 microns thick and the top surface of the buried drift layer is between 2 and 4 microns below the top surface of the epitaxial layer.

5. The integrated circuit of claim 4, wherein an average doping density of the buried drift layer is between $1 \times 10^{16}$ cm$^{-3}$ and $5 \times 10^{16}$ cm$^{-3}$.

6. The integrated circuit of claim 1, wherein the JFET is n-channel.

7. The integrated circuit of claim 1, wherein the JFET includes a linear region and a rounded end region.

8. A method of forming an integrated circuit, comprising steps:
providing a substrate having a first conductivity type;
forming a JFET in the integrated circuit, by a process including steps:
  forming an implant mask over the substrate, the implant mask including:
    a drift area wherein the substrate is exposed by the implant mask in at least 90 percent of the drift area; and
    a channel area containing segmented implant areas, so that the substrate is exposed by the segmented implant areas between 25 percent and 50 percent of the channel area and a pitch dimension of the segmented implant areas is not greater than 7 microns;
  performing an ion implant operation which implants dopants into the substrate in areas exposed by the implant mask to form a drift implanted region below the drift area and segmented channel implanted regions below the segmented implant areas;
  forming an epitaxial layer on the substrate, the epitaxial layer having the conductivity type of the substrate;
  diffusing the dopants in the drift implanted region to form a buried drift layer having an opposite conductivity type from the substrate, the buried drift layer having a drain end and a channel end;
  diffusing the dopants in the segmented channel implanted regions to form a buried channel having the conductivity type of the buried drift layer, such that the buried channel has a contiguous doping distribution, so that the buried channel is directly electrically connected to the buried drift layer at the channel end, so that an average doping density in the buried channel between 25 percent and 50 percent of an average doping density in the buried drift layer, so that an average thickness of the buried channel is between 75 percent and 100 percent of an average thickness of the buried drift layer, and so that the epitaxial layer over the buried channel forms a gate of the JFET;
  forming a drain well in the epitaxial layer extending to the drain end of the buried drift layer, the drain well having the conductivity type of the buried drift layer; and
  forming a source well in the epitaxial layer adjacent to the gate opposite the drain well, the source well having the conductivity type of the buried drift layer.

9. The method of claim 8, wherein the segmented implant areas are equally spaced.

10. The method of claim 8, wherein the segmented implant areas have a graduated spacing.

11. The method of claim 8, wherein the JFET includes a linear region and a rounded end region.

12. The method of claim 8, wherein:
the implant mask further includes a source area adjacent to the channel area opposite from the drift area wherein the substrate is exposed by a fraction at least as high as in the channel area;
the ion implant operation implants dopants into the substrate in an area exposed by the source area to form a source implanted region;
diffusing the dopants in the source implanted region to form a buried source layer having the conductivity type of the buried drift layer, so that the buried channel is directly electrically connected to the buried source layer; and
the source well extends to the buried source layer.

13. The method of claim 8, wherein the segmented implant areas are between 25 percent and 50 percent of a channel area of the JFET.

14. The method of claim 8, wherein the buried channel is between 30 and 60 microns long.

15. The method of claim 8, wherein the buried drift layer is between 3 and 7 microns thick and the top surface of the buried drift layer is between 2 and 4 microns below the top surface of the epitaxial layer.

16. The method of claim 8, wherein an average doping density of the buried drift layer is between $1 \times 10^{16}$ cm$^{-3}$ and $5 \times 10^{16}$ cm$^{-3}$.

17. The method of claim 8, wherein the JFET is n-channel.

18. A method of forming an integrated circuit, comprising steps:
forming a JFET in a substrate of a first conductivity type, by:
  forming an implant mask over the substrate, the implant mask exposing a first area for a drift region and a segmented second area for a channel region;
  performing an ion implant operation which implants dopants into the substrate in the first area and the segmented second area to form a drift implanted region in the first area and a plurality of segmented channel implanted regions in the segmented second area;
  forming an epitaxial layer on the substrate, the epitaxial layer having the first conductivity type;
  simultaneously diffusing the dopants in the drift implanted region to form a buried drift layer having an opposite conductivity type from the substrate and diffusing the dopants in the plurality of segmented channel implanted regions to form a buried channel having the conductivity type of the buried drift layer, the buried drift layer having a drain end and a channel end and the buried channel having a contiguous doping distribution, so that the buried channel is directly electrically connected to the buried drift layer at the channel end, and so that the epitaxial layer over the buried channel forms a gate of the JFET;
  forming a drain well in the epitaxial layer extending to the drain end of the buried drift layer, the drain well having the conductivity type of the buried drift layer; and
  forming a source well in the epitaxial layer adjacent to the gate opposite the drain well, the source well having the conductivity type of the buried drift layer.

19. The method of claim 18, wherein an average doping density in the buried channel is between 25 percent and 50 percent of an average doping density in the buried drift layer and an average thickness of the buried channel is between 75 percent and 100 percent of an average thickness of the buried drift layer.

20. The method of claim 19, wherein the segmented second area exposes between 25 percent and 50 percent of the channel region and a pitch dimension of the segmented implant areas is not greater than 7 microns.

\* \* \* \* \*